(12) United States Patent
Jeong

(10) Patent No.: US 7,605,074 B2
(45) Date of Patent: Oct. 20, 2009

(54) CHEMICAL MECHANICAL POLISHING AND METHOD FOR MANUFACTURING SEMICONDUCTOR DEVICE USING THE SAME

(75) Inventor: Young Seok Jeong, Busan (KR)

(73) Assignee: Dongbu Electronics Co., Ltd., Seoul (KR)

( * ) Notice: Subject to any disclaimer, the term of this patent is extended or adjusted under 35 U.S.C. 154(b) by 401 days.

(21) Appl. No.: 11/512,840

(22) Filed: Aug. 29, 2006

(65) Prior Publication Data

US 2007/0049027 A1    Mar. 1, 2007

(30) Foreign Application Priority Data

Aug. 30, 2005   (KR) ...................... 10-2005-0080011

(51) Int. Cl.
*H01L 21/4763* (2006.01)
(52) U.S. Cl. .................. 438/633; 451/36; 257/E21.23; 257/E21.304; 257/E21.571

(58) Field of Classification Search ................ 438/692, 438/694, 695, 627, 631, 633, 959; 451/5, 451/36, 41; 257/E21.23, E21.304, E21.571
See application file for complete search history.

(56) References Cited

U.S. PATENT DOCUMENTS 6,914,000 B2 *   7/2005   Kamada ..................... 438/692
7,084,056 B2 *   8/2006   Won ........................... 438/627

* cited by examiner

*Primary Examiner*—Quoc D Hoang
(74) *Attorney, Agent, or Firm*—The Law Offices of Andrew D. Fortney; Andrew D. Fortney

(57) ABSTRACT

Provided is a CMP method. According to the CMP method, an interlayer insulating layer having two or more layers is etched to form a trench and/or via hole, and a combined thickness of the two or more layers are measured. A barrier metal layer and a metal layer are sequentially formed in the trench and/or via hole. Portions of the metal layer, the barrier metal layer and the interlayer insulating layer are removed. After that, the combined thickness of the two or more insulating layers is measured again.

19 Claims, 16 Drawing Sheets

FIG. 11

| Source | VarComp | %Contribution (of VarComp) |
|---|---|---|
| Total Gage R&R | 1486.2 | 42.55 |
| Repeatability | 436.2 | 12.48 |
| Reproducibility | 1050.4 | 30.06 |
| M/C | 470.5 | 13.47 |
| M/C*Part | 579.8 | 16.6 |
| Part-To-Part | 2007.3 | 57.45 |
| Total Variation | 3493.8 | 100 |

(a) % Contribution valuation basis

| Source | StdDev (SD) | Study Var (5.15*SD) | %Study Var (%SV) | %Tolerance (SV/Toler) |
|---|---|---|---|---|
| Total Gage R&R | 38.5559 | 198.563 | 65.23 | 66.19 |
| Repeatability | 20.8852 | 107.559 | 35.33 | 35.85 |
| Reproducibility | 32.4094 | 166.908 | 54.83 | 55.64 |
| M/C | 21.6915 | 111.711 | 36.7 | 37.24 |
| M/C*Part | 24.08 | 124.012 | 40.74 | 41.34 |
| Part-To-Part | 44.8023 | 230.732 | 75.8 | 76.91 |
| Total Variation | 59.1084 | 340.408 | 100 | 101.47 |

(b) % Gage R&R valuation basis (a) Components fo Variation (b) Distribution of Machine to Machine Variation (c) Distribution of Measurement Machine (d) Interaction of Machine to Part

FIG. 15

| Source | VarComp | %Contribution (of VarComp) |
|---|---|---|
| Total Gage R&R | 1263.5 | 16.35 |
| Repeatability | 58.4 | 0.76 |
| Reproducibility | 1205.1 | 15.59 |
| M/C | 1136.4 | 14.7 |
| M/C*Part | 68.7 | 0.89 |
| Part-To-Part | 6465.7 | 83.65 |
| Total Variation | 7729.2 | 100 |

(a) % Contribution Valuation basis

| Source | StdDev (SD) | Study Var (5.15*SD) | %Study Var (%SV) | %Tolerance (SV/Toler) |
|---|---|---|---|---|
| Total Gage R&R | 35.5458 | 183.061 | 40.43 | 61.02 |
| Repeatability | 7.6412 | 39.352 | 8.69 | 13.12 |
| Reproducibility | 34.7148 | 178.781 | 39.49 | 59.59 |
| M/C | 33.7102 | 173.607 | 38.34 | 57.87 |
| M/C*Part | 8.2908 | 42.698 | 9.43 | 14.23 |
| Part-To-Part | 80.4099 | 414.111 | 91.46 | 138.04 |
| Total Variation | 87.9161 | 452.768 | 100 | 150.92 |

(b) % Gage R&R Valuation basis (a) Components fo Variation (b) Distribution of Machine to Machine Variation (c) Distribution of Measurement Machine (d) Interaction of Machine to Part

CHEMICAL MECHANICAL POLISHING AND METHOD FOR MANUFACTURING SEMICONDUCTOR DEVICE USING THE SAME

BACKGROUND OF THE INVENTION

1. Field of the Invention

The present invention relates to chemical mechanical polishing (CMP), and a method for manufacturing a semiconductor device using the same.

2. Description of the Related Art

CMP is widely used as a method for planarizing surfaces of layers and/or multi-layers during a manufacturing process of a semiconductor device. In CMP, a disk on which a CMP pad is attached is rotated, slurry is supplied to an upper end of the CMP pad, a wafer fixed on a wafer carrier is allowed to contact a surface of the CMP pad and rotate, so that a surface of a wafer is planarized using friction and a chemical component of the slurry.

Numerous fine grooves are formed in a surface of the CMP pad (which is generally formed of polyurethane) to cause friction against a wafer surface, thereby performing a polishing operation, and allow the slurry to be swiftly supplied.

As the polishing of the wafer is performed successively, abrasive particles or other kind of foreign substances contained in the slurry remain in the grooves or the grooves are worn out, which changes the surface of the CMP pad. When the CMP pad changes, a wafer-polishing degree (i.e., a polishing rate) reduces, so that a process for reproducing the surface of the CMP pad (referred to as "conditioning") is required.

During a conditioning of a CMP pad, a surface of the CMP pad is rubbed using a CMP pad dresser on which a diamond is attached, so that a changed surface state of the CMP pad is restored to an initial state.

A polishing degree during CMP can be known by optically measuring a thickness of a layer before and after a polishing operation. In this case, a problem can occur or be generated when optically measuring a thickness of the layer, and thus an error can occur.

SUMMARY OF THE INVENTION

Accordingly, the present invention is directed to CMP and a method for manufacturing a semiconductor device using the same that substantially obviate one or more problems due to limitations and disadvantages of the related art.

An object of the present invention is to provide a method of CMP and a method for manufacturing a semiconductor device using the same, capable of improving accuracy of the CMP by collectively measuring thicknesses of a plurality of layers and/or to accurately measure their thicknesses (e.g., when optically measuring a thickness of a layer).

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) and methods particularly pointed out in the written description and claims hereof as well as the appended drawings.

To achieve these objects and other advantages and in accordance with the purpose of the invention, as embodied and broadly described herein, there is provided a CMP method including: etching an interlayer insulating layer including two or more layers to form a trench and/or via hole therein; measuring first thicknesses of the two or more layers of the interlayer insulating layer; sequentially forming a barrier metal layer and a metal layer in the trench and/or via hole; removing a portion of the metal layer; removing portions of the barrier metal layer and the interlayer insulating layer; and measuring second thicknesses of the two or more layers of the interlayer insulating layer. Generally, the portions of the metal layer and the barrier metal layer (and in many cases, if not most cases, the portion of the interlayer insulating layer) are removed by CMP.

In another aspect of the present invention, there is provided a method for performing CMP on a semiconductor substrate in which two or more insulating layers having similar characteristics are stacked, the method including: measuring first thicknesses of the two or more similar insulating layers before the CMP; and measuring second thicknesses of the two or more similar insulating layers after the CMP. Typically, the method will further comprise chemical mechanical polishing a wafer containing the two or more similar insulating layers between the first and second thickness measuring steps.

In a further another aspect of the present invention, there is provided a method for manufacturing a semiconductor device, the method including: forming an interlayer insulating layer including a first insulating layer, a second insulating layer, and a third insulating layer; etching the interlayer insulating layer to form a trench and/or via hole therein; measuring a first combined thickness of the first, second and third insulating layers to measure a first thickness of the interlayer insulating layer; sequentially forming a barrier metal layer and a metal layer in the trench and/or via hole; removing portions of the metal layer, the barrier metal layer, and the third insulating layer (e.g., to form a metal line in the trench); and measuring a second combined thickness of the first, second and third insulating layers to measure the thickness of the entire interlayer insulating layer after polishing. Generally, the portions of the metal layer, the barrier metal layer, and the third insulating layer are removed by CMP.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 11 is a table showing results obtained by measuring only one upper layer using a measurement apparatus;

FIG. 15 is a table showing results obtained by measuring three upper layers using a measurement apparatus;

DETAILED DESCRIPTION OF THE INVENTION

Reference will now be made in detail to the preferred embodiments of the present invention, examples of which are illustrated in the accompanying drawings.

A method for manufacturing a semiconductor device according to an embodiment of the present invention will be described with reference to FIGS. 1A to 1D.

Figure 1A:
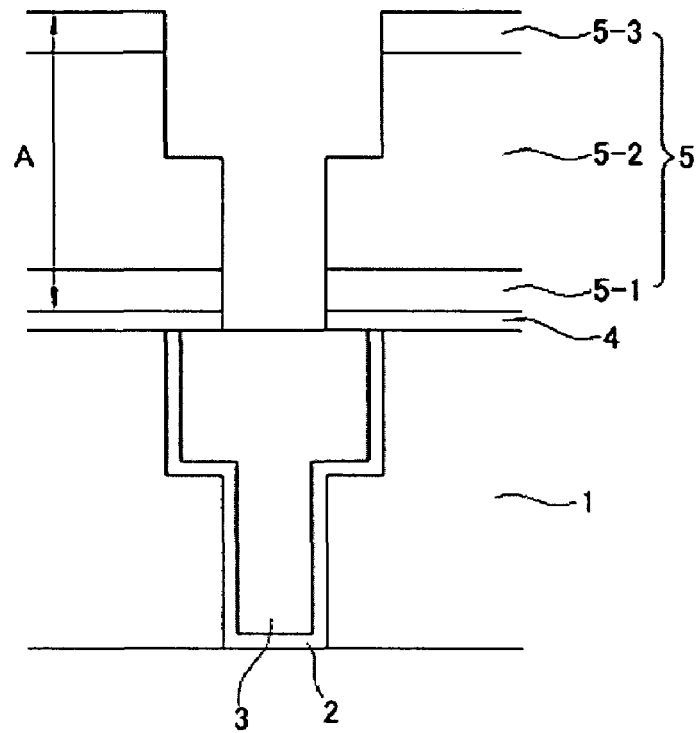
FIGS. 1A to 1D are cross-sectional views of a semiconductor device on which CMP is performed according to an embodiment of the present invention.

First, referring to FIG. 1A, an insulating layer 1 is formed (generally by depositing one or more insulator layers) on a semiconductor substrate (not shown), a trench and via hole is formed in the stacked insulating layer 1, a first barrier metal layer 2 is deposited thereon. After that, the trench and via hole are filled with a metal layer 3, and portions of the metal layer 3 and the first barrier metal layer 2 that are located above an upper portion of the insulating layer 1 are removed using CMP, so that a lower structure of the semiconductor device is completed.

After that, a silicon nitride layer 4 and an interlayer insulating layer 5 are stacked, and another trench and via hole are formed in the stacked layers 4 and 5 as illustrated in FIG. 1A.

Figure 1B:
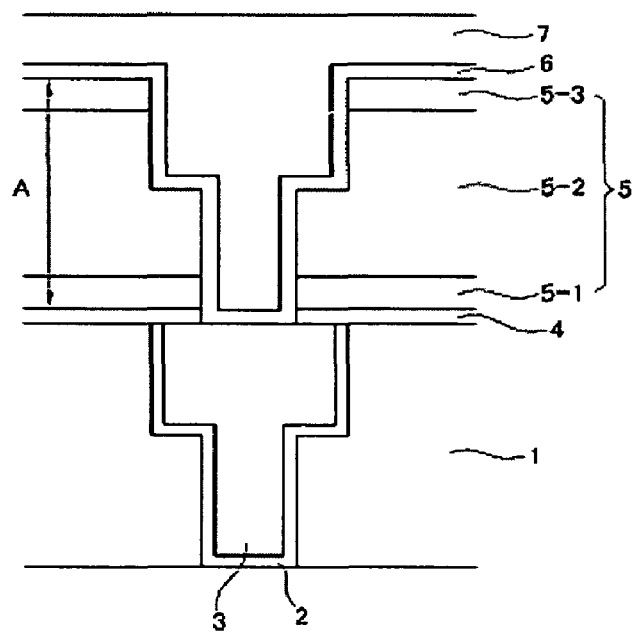
Figure 1C:
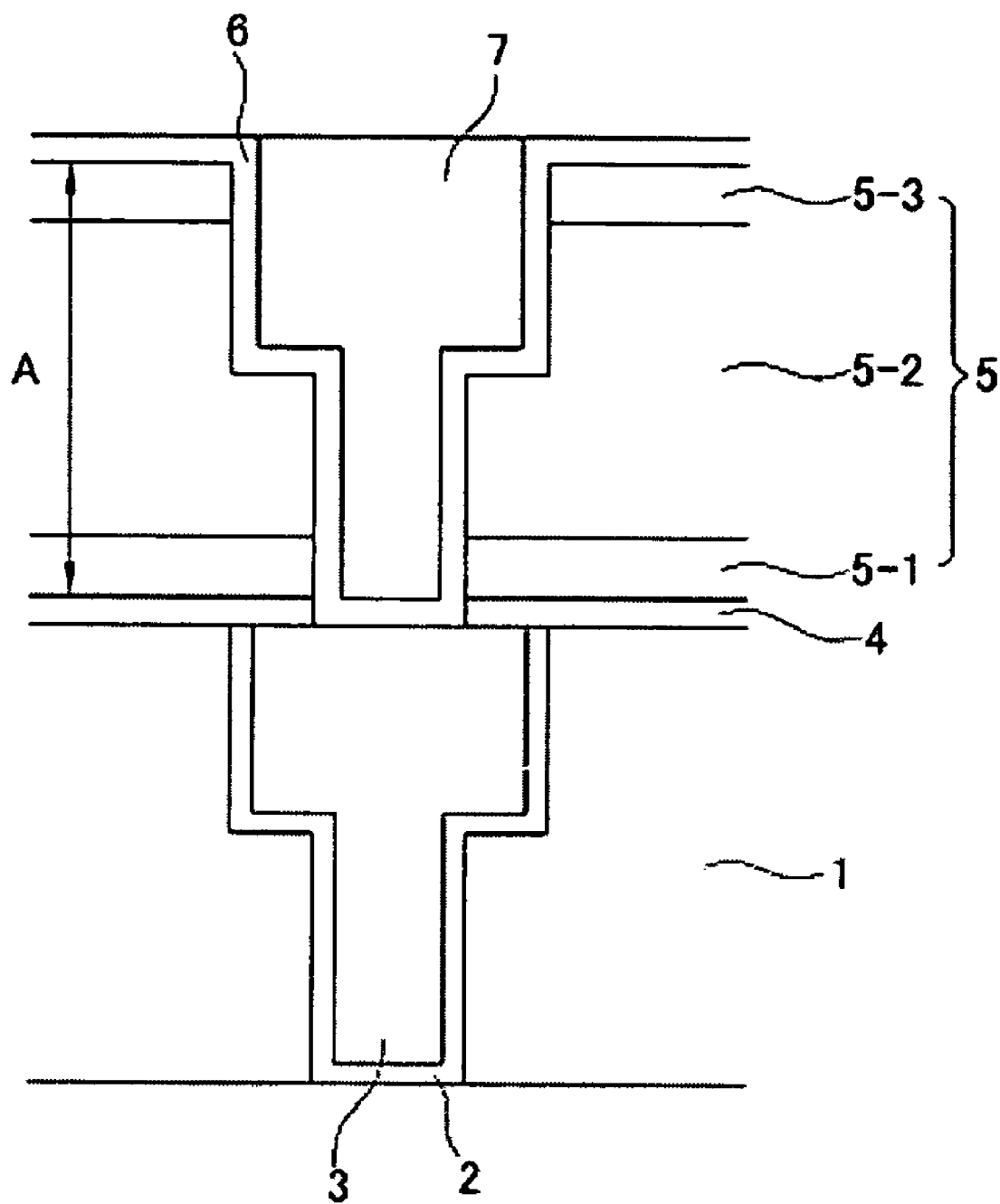

Referring to FIG. 1B, a second barrier metal layer 6 and a copper line 7 are formed in the trench and via hole. After that, a structure illustrated in FIG. 1C may be formed through a first etching operation for removing a bulk copper portion. Alternatively, the bulk copper portion above the substantially horizontal portion of the second barrier metal layer 6 may be removed by a first CMP step or a first portion of a single-step CMP process for removing portions of both second barrier metal layer 6 and copper line 7 outside of the trench and via hole etched into the interlayer insulating layer 5 (see FIG. 1A).

Figure 1D:
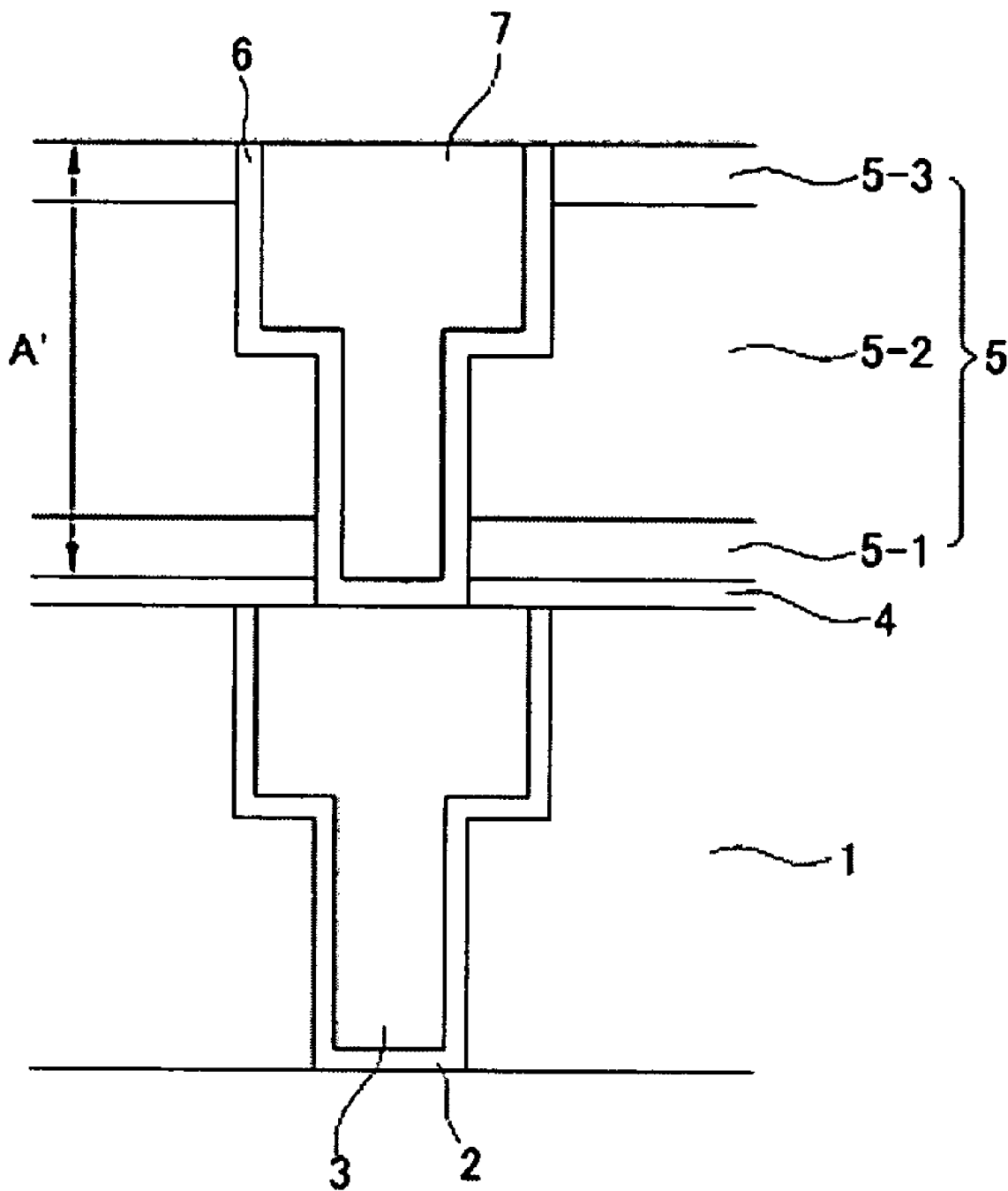

Subsequently, and referring again to FIG. 1C, a portion of the second barrier layer 6 and a predetermined thickness of the interlayer insulating layer 5 may be removed through a second etching operation, so that a semiconductor device illustrated in FIG. 1D is completed. Alternatively, as explained above, the portion of second barrier metal layer 6 outside of the trench and via hole etched into the interlayer insulating layer 5 may be removed by a second CMP step or a second portion of the single-step CMP process for removing portions of both second barrier metal layer 6 and copper line 7 from outside the trench and via hole.

For calculation of a polishing amount during CMP when a semiconductor device is formed through the above-described process, a thickness of a layer is measured in the operations of FIG. 1A and FIG. 1D, and the polishing amount is calculated using a difference between the measured thicknesses.

In the related art, only a thickness of a third interlayer insulating layer 5-3 is measured in operations of FIG. 1A and FIG. 1D. In contrast, according to the present invention, an entire thickness of two or more (preferably all) of the layers of the interlayer insulating layer 5 is measured in operations of FIG. 1A and FIG. 1D, and a polishing amount is calculated using a difference between the measure thicknesses.

Figure 14:
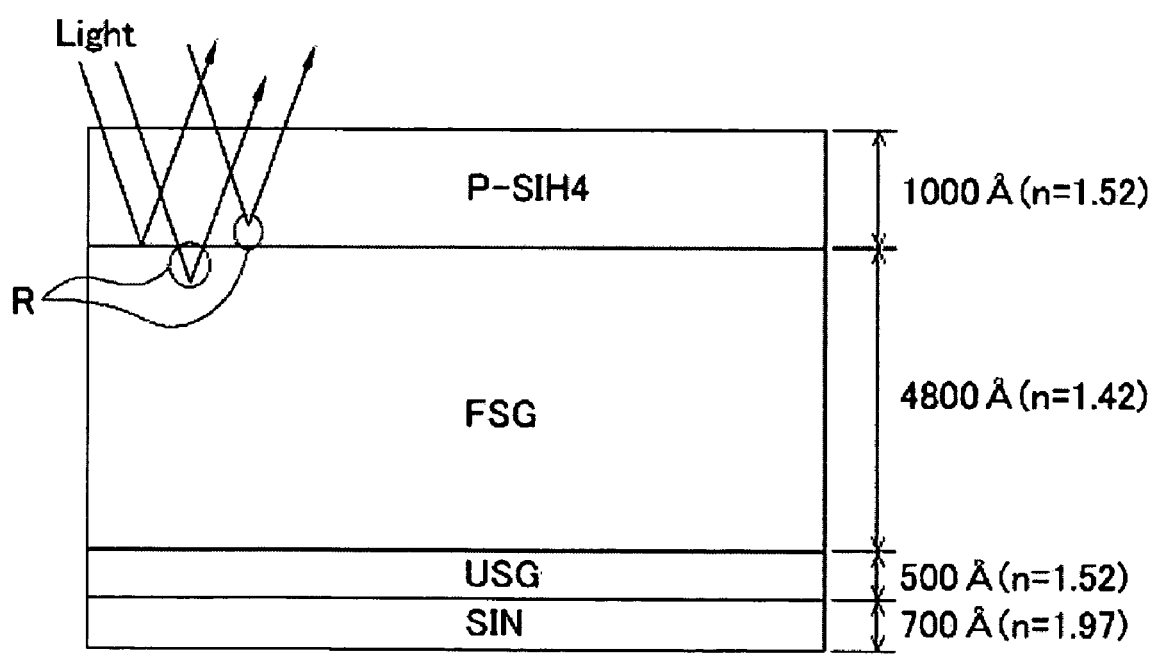
FIG. 14 is a cross-sectional view illustrating an insulating layer of a semiconductor.

In the interlayer insulating layer 5, referring to FIG. 14, the third interlayer insulating layer 5-3 located in an uppermost layer comprises or consists essentially of a plasma silane (P—SiH$_4$), a second interlayer insulating layer 5-2 located under the third interlayer insulating layer 5-3 comprises or consists essentially of a fluorine-doped silica glass (FSG), and a first interlayer insulating layer 5-1 located under the second interlayer insulating layer 5-2 comprises or consists essentially of an undoped silicate glass (USG). The plasma silane layer is generally formed by the plasma-enhanced or plasma assisted chemical vapor deposition (PECVD) of silicon dioxide from silane (SiH$_4$) and an oxygen source, such as O$_2$ gas. These three insulating layers may be replaced by or supplemented with other insulators, such as HDPCVD oxide (silicon dioxide deposited by high density plasma-assisted CVD), SiOC (silicon oxycarbide, or "black diamond"), SiOCH (hydrogenated silicon oxycarbide), boron- and/or phosphorous-doped silicate glasses (e.g., BSG, PSG, BPSG), a TEOS-based oxide, etc. For example, the plasma silane may be replaced or supplemented with a TEOS-based oxide, the FSG may be replaced with BPSG, SiOC and/or SiOCH, and/or the USG may comprise, be replaced with or be supplemented with HDPCVD oxide. A silicon nitride layer 4 (SiN or thermal nitride) is located under the first interlayer insulating layer 5-1.

Generally, in the present CMP process, the USG, the FSG, and the P—SiH$_4$ have thicknesses of about 400-600 Å, about 4000-6000 Å 400-600 Å, and 100-2000 Å, respectively, in the interlayer insulating layer 5. The CMP process can be properly performed when the three insulating layers have these exemplary thicknesses, although such thicknesses are not required to obtain the benefits of the invention.

For example, referring to FIG. 14, the third interlayer insulating layer 5-3 has a thickness of 1000 Å, the second interlayer insulating layer 5-2 has a thickness of about 4800 Å, and the first interlayer insulating layer 5-1 has a thickness of about 500 Å.

Also, the silicon nitride layer 4 (thermal nitride) under the first interlayer insulating layer 5-1 has a thickness of 600-800 Å to effectively serve as a lower barrier and/or etch stop layer for trench and/or via hole etching. For example, the silicon nitride layer 4 may have a thickness of 700 Å. Thus, in an alternative, the present invention can be used for conventional tungsten CMP (e.g., where the barrier metal comprises conventional TiN, optionally with an underlying conventional Ti adhesive layer, and a bulk tungsten contact material, deposited by CVD).

Meanwhile, a thickness of a layer is measured using an optical method. The first to third insulating layers have similar properties, and an appreciable (and sometimes large) amount of light (illustrated by R in FIG. 14) may be reflected by portions other than a boundary between layers.

Consequently, an error may occur when a thickness of the third insulating layer 5-3 is measured. Consequently, the present invention results from a recognition that a thickness of an entire interlayer insulating layer 5 having layers with similar characteristics to the third layer 5-3 may be used to determine a polished thickness of the third layer 5-3.

Problems occurring when a related art method is used, and improvements when the present invention is used will be described below.

Referring to FIGS. 1B and 1D, one type of copper CMP process manufactures a copper metal line using two operations. In a first operation, bulk copper is removed. In a second operation, predetermined portions of the barrier metal layer 6 and the interlayer insulating layer 5 are removed in order to prevent short-circuit between metal layers.

In part, performance of the copper CMP process is appraised by a removal rate (RR) determining an amount of the interlayer insulating layer 5 that is removed in the second operation, and non-uniformity (NU) representing irregularities of an entire surface of a wafer after polishing.

When a polishing amount is not sufficient during a CMP process, metal remains on the interlayer insulating layer 5, causing short-circuit(s) between lines. On the other hand, when a polishing amount is excessive, the amount of the interlayer insulating layer 5 removed by polishing increases, which changes the resistance and/or conductivity of the metal line and influences device characteristics (such as the lifetime of the device, parasitic capacitance, the device yield and certain processing and/or operational corners, etc.).

Also, when NU defining a planarization degree of a wafer increases, a process margin may decrease, so that performance of a subsequent photolithography process may be reduced. Also, since a possibility increases that residual metal may remain when NU increases, performance of the CMP process may also decrease.

Therefore, it is important to manage and/or achieve a relatively constant RR and NU, which are performance appraisal factors of a CMP process in an aspect of product yield. Accordingly, analyzing and improving an error budget of a copper CMP process is desirable.

The error budget of the copper CMP process is defined by Equation 1:

$$\text{ErrorBudget} = \sqrt{A^2 + B^2 + C^2} \quad [1]$$

where A (max WIW NU) is the largest value of NU values at the wafer measurement points (e.g., nine points on all wafers), B (max WTW NU) is the largest value of NU values between wafers within a lot, and C (max LTL NU) is an NU value for an average of a sample across a number of lots (e.g. all lots).

As revealed from Equation 1, the error budget is obtained by selecting, measuring and/or identifying a largest value of NU values occurring from Within-Wafer (WIW), Wafer-to-Wafer (WTW), and Lot-to-Lot (LTL), and calculating an RMS (root mean square) of the largest values. The error budget corresponds to a maximum range of the NU that can occur during the CMP process, while keeping the process within allowable tolerances (e.g., for yield). Therefore, an analysis of the error budget may provide a maximum deviation from a target NU value for a CMP processing specification.

Figure 2:
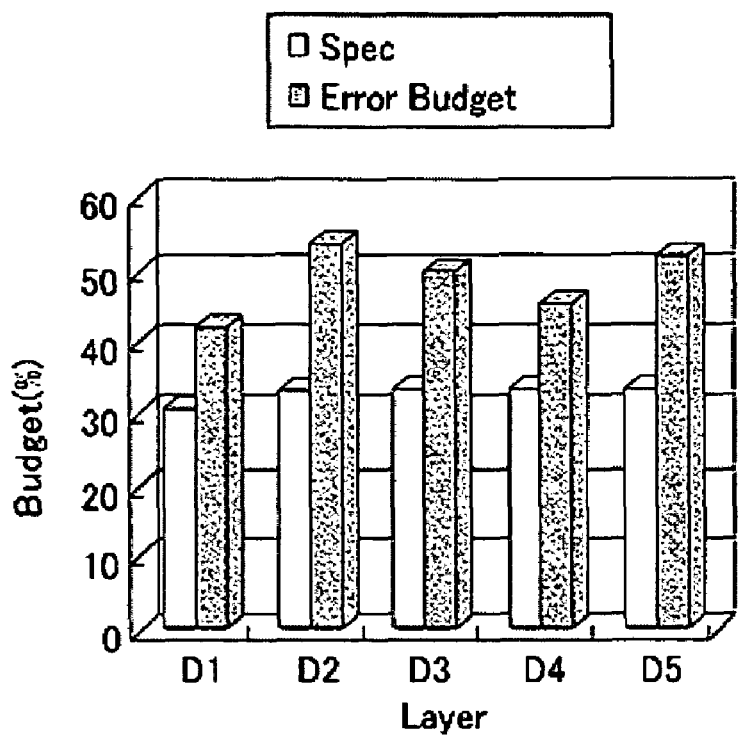
FIG. 2 is a graph analyzing an error budget of CMP for a 130 nm-copper.

FIG. 2 illustrates a copper CMP error budget calculated using the above-described method. The error budget is calculated on the basis of in-line data for a semiconductor wafer product that is manufactured using a copper CMP process that has not necessarily been managed for NU variations as described herein.

The error budget in FIG. 2 shows that in a copper CMP process that has not necessarily been managed for NU variations, all layers D1-D5 in a plurality of product groups have an error budget of 42-53% (although a limit of 30-32% is defined in the specification as an example of commercially acceptable error budget) from a center or target value. The meaning of the analysis can be illustrated in FIG. 3.

Figure 3:
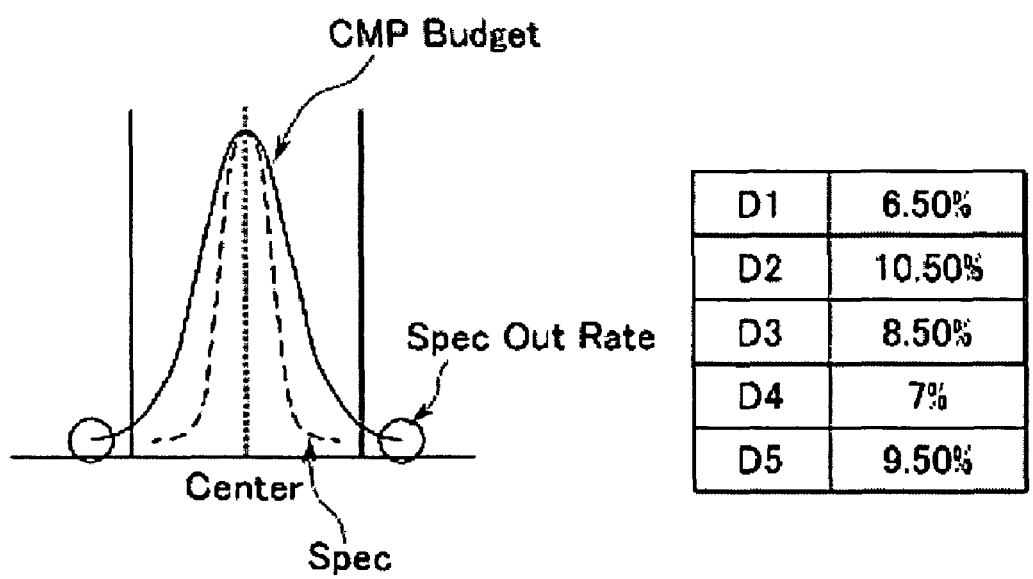
FIG. 3 is a graph illustrating a range of an error budget of CMP for a 130 nm-copper.

FIG. 3 points out that up to 10.5% of the products mass-produced according to a copper CMP process that has not necessarily been managed for NU variations can deviate beyond the maximum specification (or commercially acceptable limits) for a CMP error budget.

Figure 4:
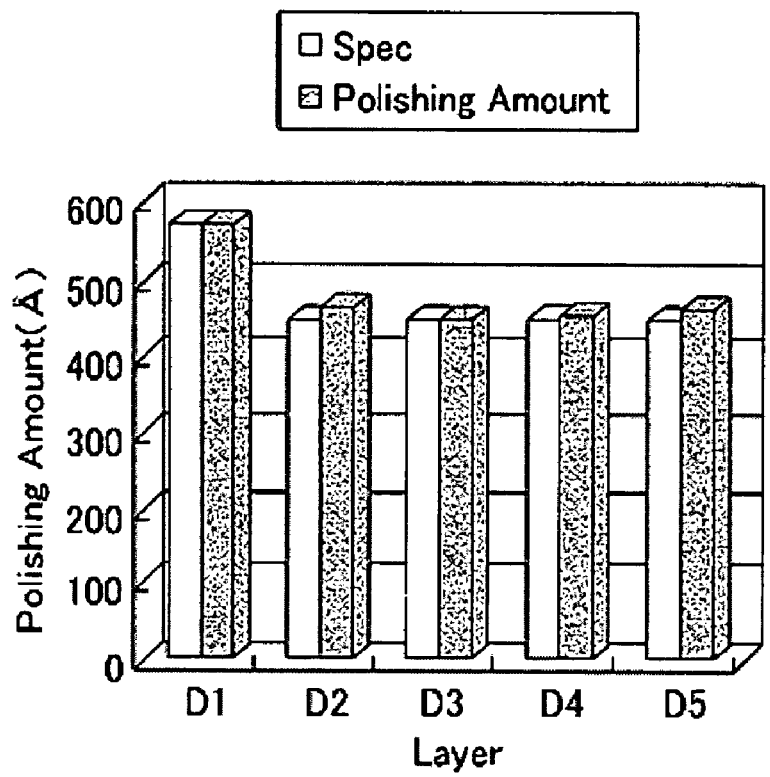
FIG. 4 is a graph illustrating an amount of CMP for a 130 nm-copper.

However, unlike the above-described error budget analysis, analysis of a polishing amount (e.g., the reduction in thickness of the uppermost insulating layer after polishing) used as a copper CMP process management factor shows results illustrated in FIG. 4.

FIG. 4 shows an average polishing amount over three months for a semiconductor product currently in mass production. Referring to FIG. 4, an average polishing amount of a CMP process maintains a center value on the specification (parent group D1: 575±175 Å, parent group D2-D5: 450±150 Å). In this copper CMP process, an average polishing amount is managed or monitored by measuring thicknesses at nine points on an entire surface of a wafer. However, the error budget in this CMP process is at least sometimes out of specification (i.e., when the error budget exceeds the upper limit defined in the specification), as described above.

Therefore, the average polishing amount alone may not be sufficient in accurately estimating occurrence of deviations from the specification during the CMP process. Therefore, the copper CMP error budget should be analyzed, managed and/or monitored, in order to reduce a percentage of products deviating from the specification and produce products of higher quality and/or in higher yields.

Since the error budget that predicts worst state of the CMP process is calculated by maximum NU values of WIW, WTW, and LTL, the error budget may be greatly influenced by values at one or two points that greatly deviate from the acceptable range in the specification. Therefore, such error(s) may be analyzed for each measurement position, and a cause thereof can be examined and/or determined in order to accurately analyze the copper CMP process and/or bring the CMP process back within limits of the specification. For examination of the cause, a statistical analysis method such as analysis of variance (ANOVA) may be used to divide variation factors for a polishing amount measured during the copper CMP process into process variation factors and error variation factors.

Figure 5:
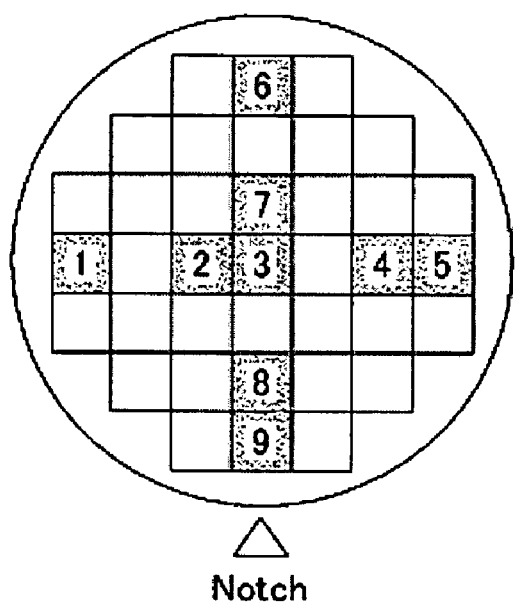
FIG. 5 is a view illustrating measurement points for analysis on a wafer.

To examine a significance difference and a variance factor of a polishing amount occurring during the CMP process, a statistical analysis (e.g., an ANOVA analysis) has been performed on the basis of polishing amounts at four points located at predetermined (e.g., the same) positions in a radial direction of a wafer (e.g., positions 1, 5, 6 and 9 in FIG. 5).

FIG. 5 shows thickness measurement positions. In FIG. 5, significant differences for polishing amounts at points 1, 5, 6 and 9, located at the same radial position, among the data taken at nine points measured at measurement positions of FIG. 5 have been measured. In FIG. 5, positions 4 and 8, and/or positions 2 and 7, may be considered the same radial position (i.e., the same position in a radial direction). Additional samples may be taken along the same or different radii. Position 3 is generally the center (or radial origin) of the wafer.

The CMP process removes a material (generally, the uppermost, or exposed, material) using friction generated when a pad and a wafer each rotate with respect to each other. Typically, the pad is rotated such that the wafer has the same linear velocity (e.g., a constant velocity) in a radial direction of the wafer. Therefore, CMP has the same RR in the radial direction of the wafer.

Figure 6:
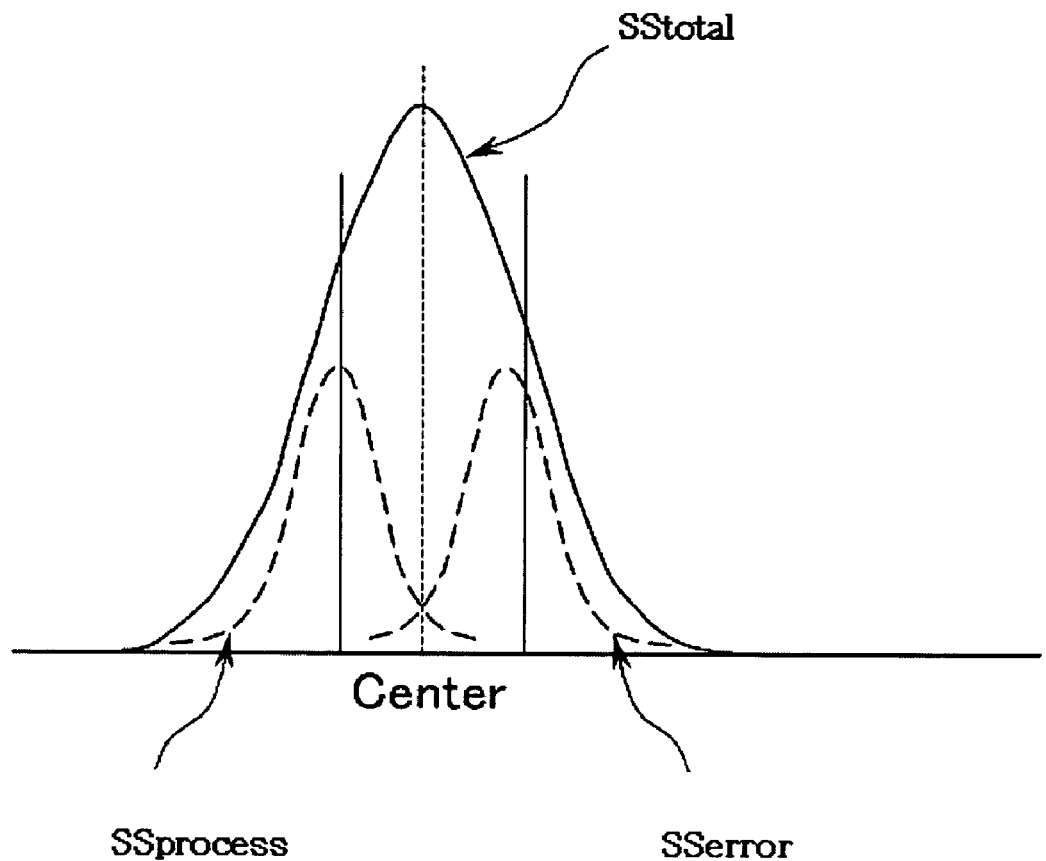
FIG. 6 is a total variation graph during a process, divided into a process level variation and an error variation.

Therefore, an ANOVA analysis has been performed on polishing amounts at the same radial positions of the wafer that are expected to have similar RRs. Through this statistical analysis, a total variation factor (SStotal) generated during a CMP process is divided into an actual process factor variation (SSprocess) and an error factor variation (SSerror), as illustrated in FIG. 6.

TABLE 1

Analysis of Variance for Polishing Amount, Using Adjusted SS for Tests

| Source | DF | Seq SS | Adj SS | Adj MS | F | P |
|---|---|---|---|---|---|---|
| Lot | 53 | 1451970 | 1451778 | 27392 | 5.49 | 0.000 |
| Slot | 2 | 9806 | 9737 | 4868 | 0.98 | 0.377 |
| Point | 3 | 120175 | 120175 | 40058 | 8.03 | 0.000 |
| Error | 588 | 2931939 | 2931939 | 4986 | | |
| Total | 646 | 4513891 | | | | |

Table 1 shows ANOVA results for polishing amounts of copper CMP. Analysis of polishing amounts for each lot, each slot, and each point using the ANOVA shows that the lot-to-lot and the point-to-point analyses have a P-value of 0.05 or less and thus have a significant difference, and that the slot-to-slot analysis does not have a significant difference. Therefore, data variance factors of the lot-to-lot and the point-to-point analyses and/or variations showing a significant difference through the ANOVA are examined as shown in Tables 2 and 3.

TABLE 2

One-way ANOVA: Polishing Amount versus Point

| Source | DF | SS | MS | F | P |
|---|---|---|---|---|---|
| Point | 3 | 121237 | 40412 | 5.92 | 0.001 |
| Error | 643 | 4392654 | 6831 | | |
| Total | 646 | 4513891 | | | |

TABLE 3

One-way ANOVA: Polishing Amount versus Lot

| Source | DF | SS | MS | F | P |
|---|---|---|---|---|---|
| Lot | 53 | 1451970 | 27396 | 5.31 | 0.000 |
| Error | 593 | 3061920 | 5163 | | |
| Total | 646 | 4513891 | | | |

Tables 2 and 3 show that polishing amounts of the point-to-point and the lot-to-lot analyses have a P-value of 0.05 or less and thus have a significant difference. Also, Tables 2 and 3 show that the ratio of process factor variations to error factor variations (e.g., the effect of error factor variations on total variation in the process) has a significant difference.

The ANOVA is a method for checking whether a data variation (dispersion) is due to a condition. This can be checked using an MS value of analysis results. Referring to Tables 2 and 3, an MS value discriminates between a point-to-point variation, a lot-to-lot variation, and an error factor variation among all data variation factors.

Figure 7:
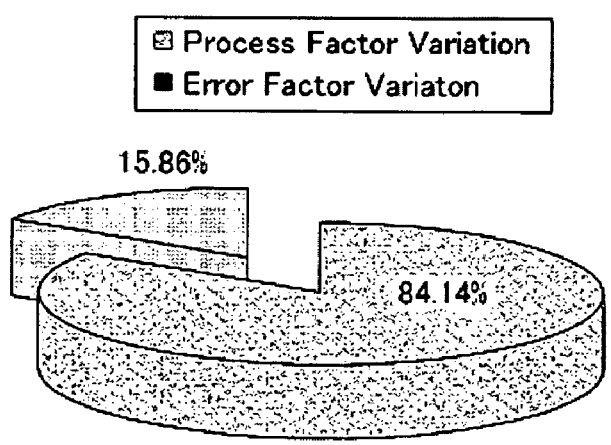
FIG. 7 is a graph illustrating a variation between measurement points on a wafer.
Figure 8:
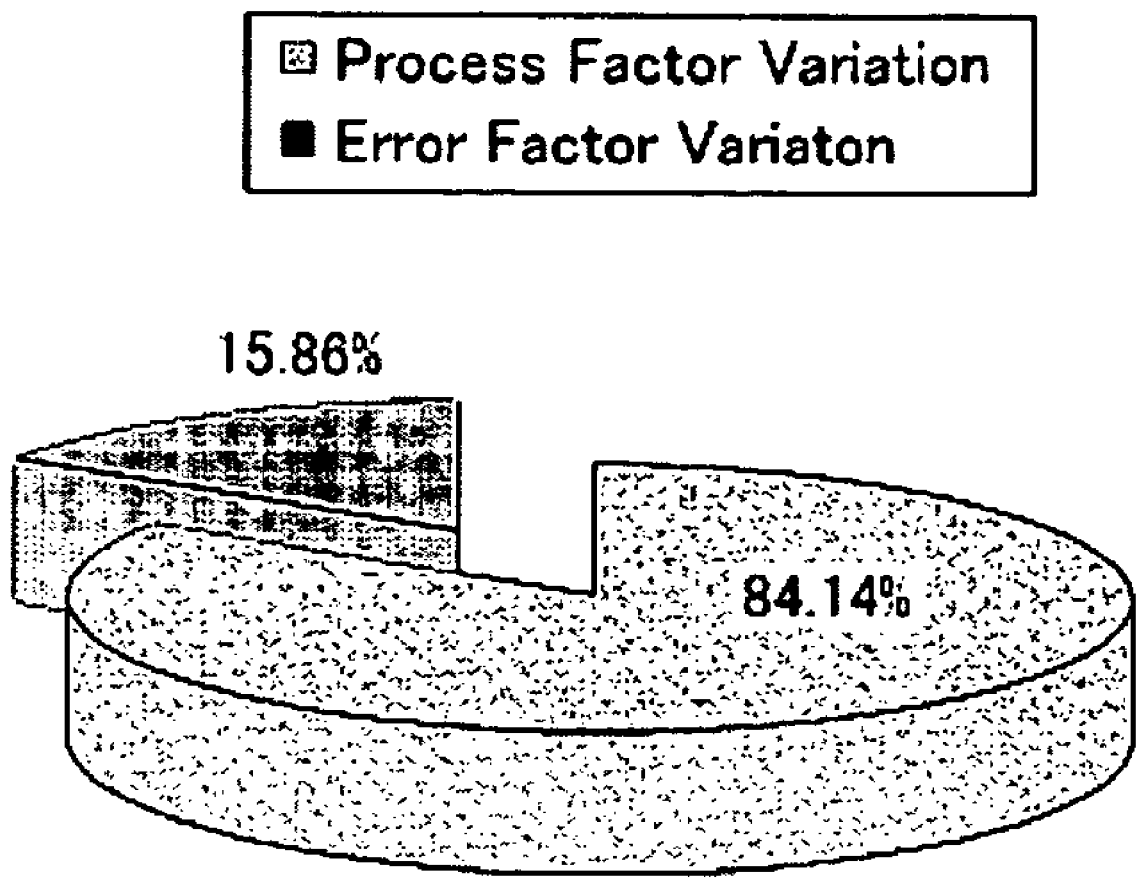
FIG. 8 is a graph illustrating a variation between lots.

FIGS. 7 and 8 illustrate a ratio of such variation factors.

The above analysis results show that factors having an influence on a variation in polishing amounts at the same radial point of a wafer during a copper CMP process include a process factor variation and an error factor variation, and that the error factor variation contributes a considerable portion (e.g., 14-16%) of the whole variation. Therefore, it is important to accurately examine and regulate the error factor variation in a copper CMP error budget analysis.

An error factor variation for polishing amounts in a copper CMP is examined for other sample groups using the same analysis method used in FIGS. 5 to 8. The error factor variation is shown in FIGS. 9 and 10.

Figure 9:
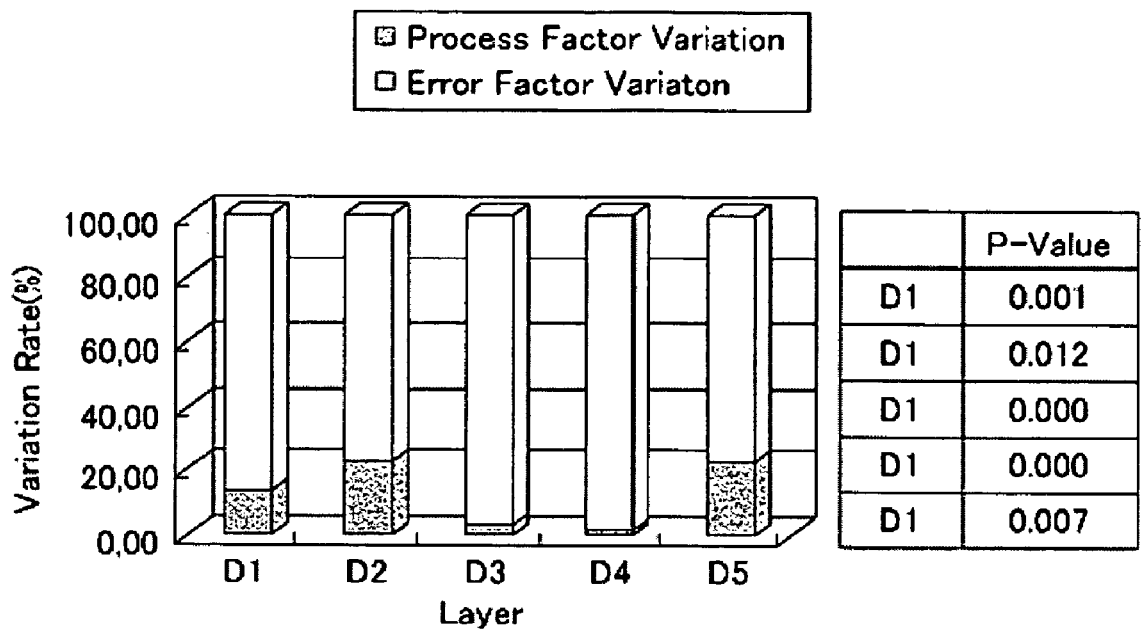
FIG. 9 is a graph illustrating a variation between measurement points on a wafer, examined for a plurality of embodiments.
Figure 10:
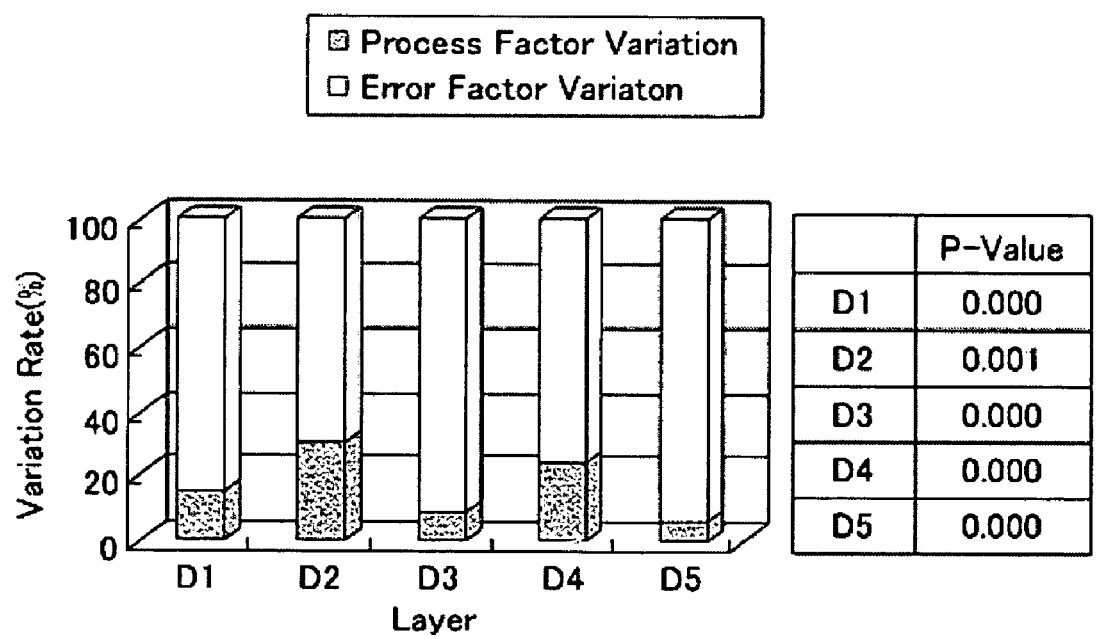
FIG. 10 is a graph illustrating a variation between lots, examined for a plurality of embodiments.

FIGS. 9 and 10 show that all data contained in the sample group have a significant difference and that an error factor variation occupies an appreciable (and in some cases, large) portion (2-36%) of the total variation factor.

The above-statistical analysis shows that polishing amounts at four points, located at the same radial positions on a wafer, during the copper CMP process have a significant difference. The difference can have an influence on product quality and yield. Therefore, it can be very important in producing a high quality product to monitor, manage and/or analyze factor(s) having an influence on the variation in the polishing amount.

Therefore, the error variation generating factor(s) that can cause this difference may also be analyzed. The error variation factors can be roughly divided into CMP process factors and measurement equipment factors. To reduce the error variation factors, influence of the CMP process factor(s) should be reduced. For this purpose, error factor(s) from the measurement equipment should be clearly examined.

For this purpose, a gauge repeatability and reproducibility (R&R) determination for an opti-probe, which is a measurement apparatus, is performed. An experiment is performed using a thin film 1-bay apparatus for measuring a thickness before a CMP operation, and two opti-probe apparatuses for measuring a thickness after polishing.

Five wafers are measured one time, and then measured again in a different order. FIG. 11 shows the gauge R&R results. Polishing amounts at the same radial positions of a wafer are analyzed as in the above-described method.

FIG. 11 is a table showing results obtained by measuring only one upper layer (e.g., the uppermost insulator layer) using a measurement apparatus. Referring to FIG. 11(a) showing a % Contribution valuation basis, 2% or less is generally considered excellent, 2-7.7% is good, and 7.7% or more may be considered commercially unacceptable. Referring to FIG. 11(b) showing a % Gage R&R valuation basis, 10% or less is generally considered excellent, 10-30% is good, and 30% or more may be considered commercially unacceptable.

Analysis of the results of FIG. 11 show that the % Contribution is 7.7% or more (42.55%), and the % Gage R&R is 30% or more (65.23%). This says that the measurement apparatus and/or gage should be improved.

Figure 12A:
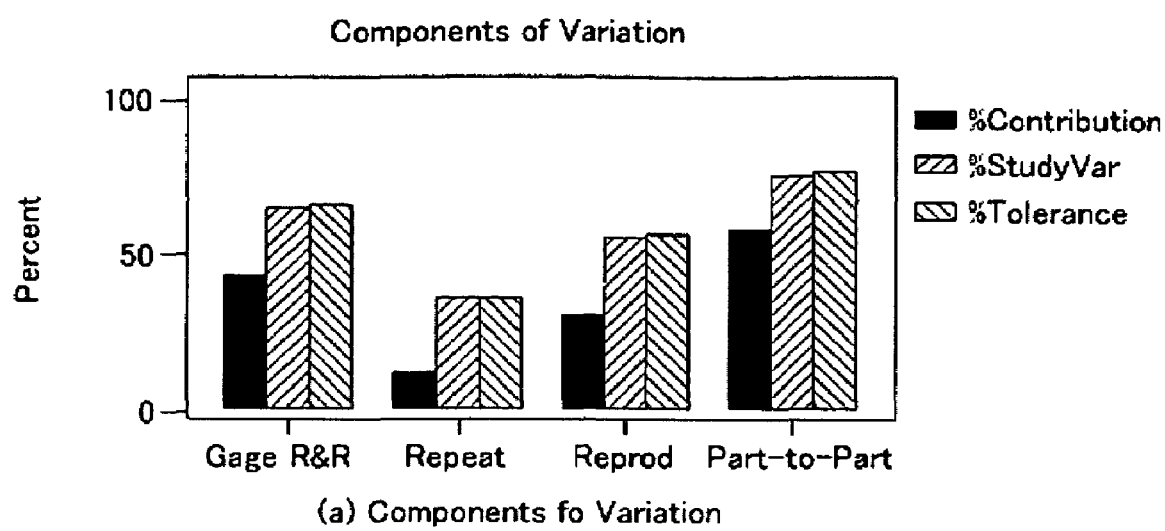
FIG. 12 is a graph showing results obtained by measuring only one upper layer using a measurement apparatus.

Also, a ratio or percentage contributed by a gage in a total variation occurring for each part (a measurement point) in FIG. 12A is 42.55%, and a Part-to-Part variation ratio originating from the CMP process is 57.45%. Also, reproducibility of 30.06% between measurement apparatuses occupies a larger portion of the total variation than repeatability (12.48%) within a given measurement apparatus.

Figure 12B:
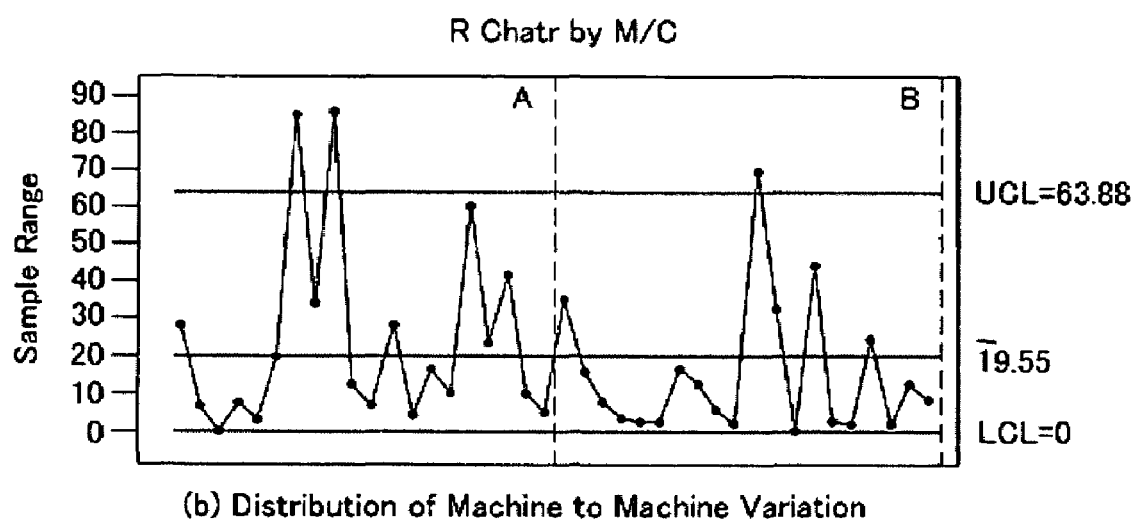

FIG. 12B is a graph illustrating a variation between measurement apparatuses, showing that a difference between measurement apparatuses is small as the number of points deviating from an allowable range (UCL=maximum) is small. Since a value deviating from an allowable range exists according to analysis results, there is a difference between measurement apparatuses.

Figure 12C:
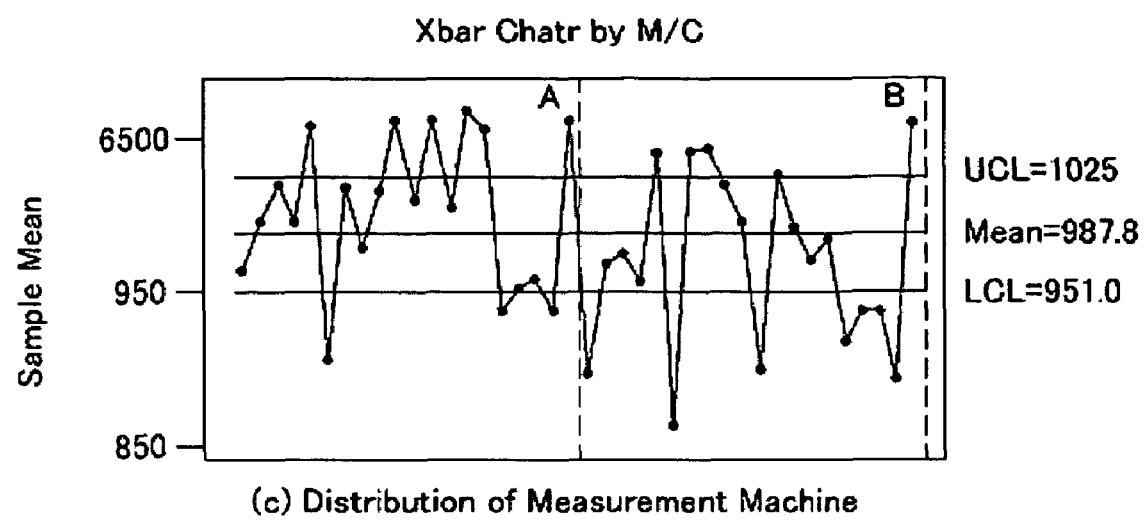

FIG. 12C is a graph illustrating a part-to-part difference or variation, in which points located inside the LCL-UCL range represent errors by the measurement equipment, and points outside the range represent differences part-to-part. Analysis results show that there are lots of errors by the measurement equipment.

Figure 12D:
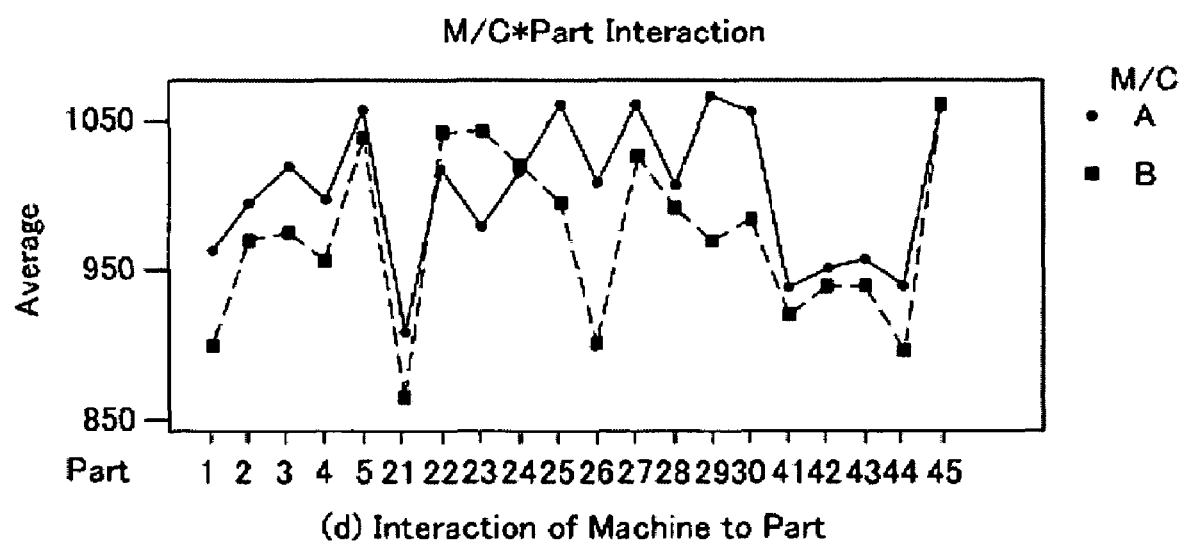

FIG. 12D illustrates interaction between a part and the measurement equipment. As two lines coincide, the measurement equipment measures differently depending on the variation of the part, which means that measurement is normally performed. However, analysis results show that measurement equipment does not always measure variations of the part differently, which means that there are errors in the measurement equipment.

Figure 13:
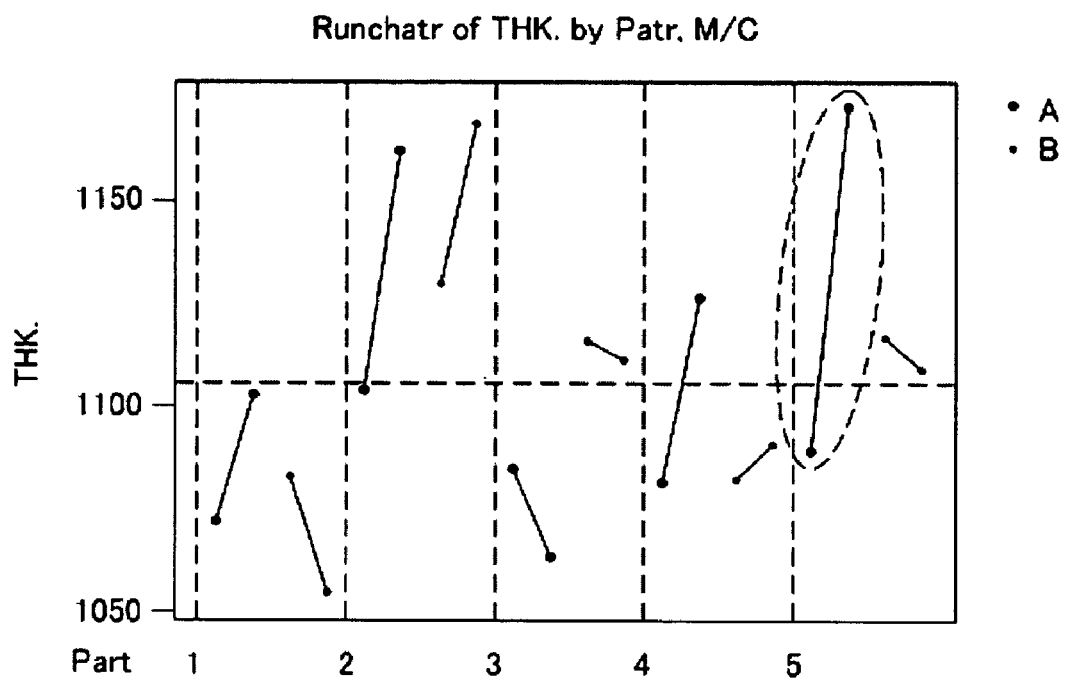
FIG. 13 is a graph showing a variation in a thickness obtained by measuring only one upper layer using a measurement apparatus.

FIG. 13 shows thicknesses obtained by repeatedly measuring the same measurement point (point No. 8) when measurement is performed before and after a CMP operation. As can be determined from FIG. 13, even though the same point of the same wafer is measured, the measurement equipment exhibits a maximum difference of 85 Å. This value is 29% of 300 Å, the lower limit of the corresponding CMP specification range (450±150 Å). The difference shows that measurement equipment for appraising a performance of a 130 nm copper CMP may have errors.

An error budget analysis for appraising a CMP process is calculated on the basis of uniformity data. Therefore, an error for each point occurring in the measurement equipment may reduce uniformity, which may further reduce the error budget of the CMP process. Therefore, it is beneficial to understand a process characteristic through the error budget analysis of the CMP process and to improve measurement equipment in order to find out improvement points.

As described above, a polishing amount for appraising copper CMP process performance contains considerable errors in the measurement equipment. A reason the errors occur originates from characteristics of the measurement equipment. In this case, the measurement equipment calculates a thickness of a material using a refractive index of the material with respect to light through an optical measurement device and method. The refractive index is a unique characteristic of the material being measured.

However, referring to FIG. 14, many different insulation layer materials are oxides, having similar refractive indexes. Therefore, measurement equipment used in copper CMP processing does not necessarily accurately discriminate or determine a boundary between different materials. For example, one conventional copper CMP process calculates a polishing amount using only a thickness of the third interlayer insulating layer, P—SiH$_4$. As a result, referring to FIG. 14, a point at which a copper CMP polishing amount is calculated may contain one or more errors that can occur in the measurement equipment (refer to R of FIG. 14).

To reduce errors occurring at a point at which the boundary between similar oxide layers cannot be accurately and/or reliably determined, gage R&R is performed again using a new measuring method based on a value obtained by summing the thicknesses of a plurality of insulator layers (e.g., three oxide layers, or the first to third layers in the interlayer insulating layer) measured, respectively. Results of the new measuring method are shown in FIG. 15.

FIG. 15 is a table showing results obtained by measuring three upper layers using a measurement apparatus.

Referring to FIG. 15(a) showing a % Contribution valuation basis, 2% or less is generally considered excellent, 2-7.7% is good, and 7.7% or more may be considered commercially unacceptable. Referring to FIG. 15(b) showing a % Gage R&R valuation basis, 10% or less is generally considered excellent, 10-30% is good, and 30% or more may be considered commercially unacceptable.

Referring back to FIG. 11, when analysis is made using only a thickness of the third interlayer insulating layer, a contribution value is 42.55%, which suggests improvement of gage. On the other hand, and referring to FIG. 15, when analysis is made using the new measuring method summing thicknesses of similar oxide layers in the interlayer insulating layer (i.e., first to third insulating layers 5-1 to 5-3 in FIGS. 1A-1D), the % contribution value is 0.76%, and the % Gage R&R is 8.69%, so that repeatability, which is an error factor of measurement equipment, is remarkably improved to an excellent state.

Figure 16A:
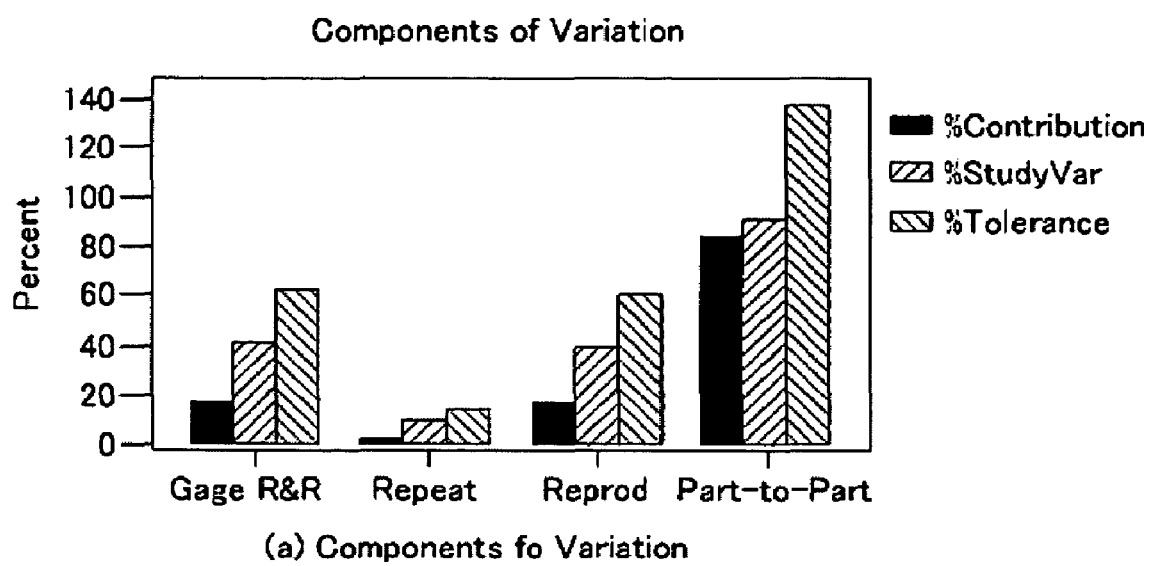
FIG. 16 is a graph showing results obtained by measuring three upper layers using a measurement apparatus.

Also, referring to FIG. 16A, a ratio or percentage of variation contributed by a gage is 16.35%, and a part-to-part variation ratio originating from a CMP process is 83.65% in the total variation occurring for each part (measurement point), which shows that an error by a gage is reduced by 26.02% compared to the related art method described herein.

Figure 16B:
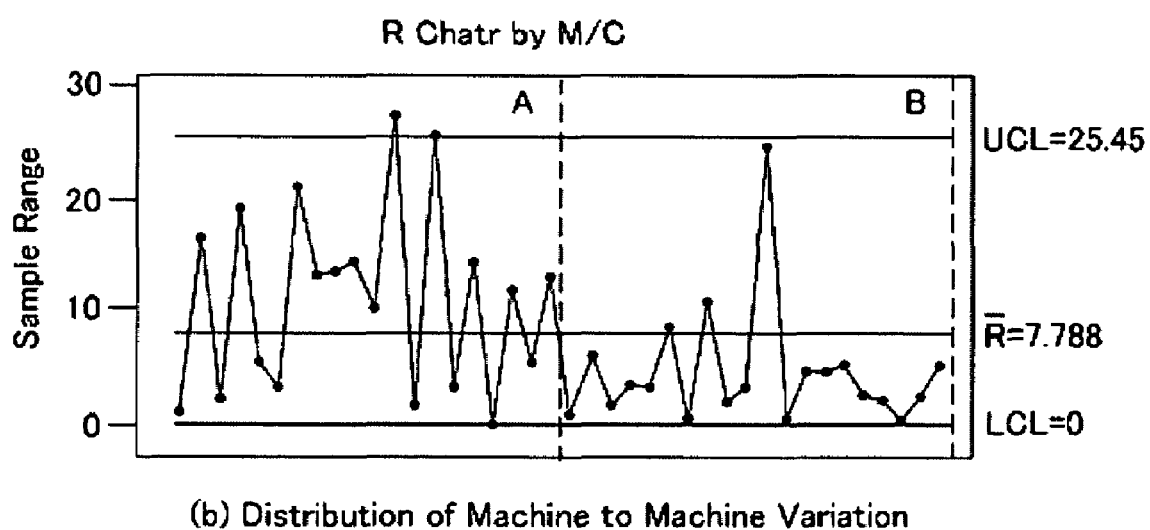
Figure 16C:
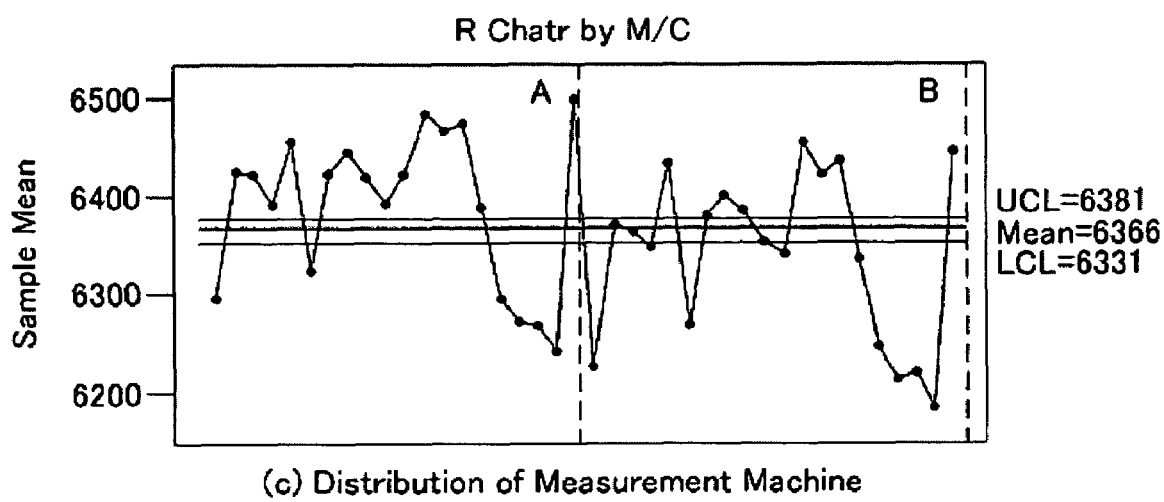

Referring to FIG. 16B, since most data are distributed within the allowed range, the part-to-part error is generally greater than the measurement-equipment (apparatus-to-apparatus) error. Referring to FIG. 16C, since most data are distributed outside the LCL-UCL range, the measurement-equipment error is almost not present in the total variation.

Figure 16D:
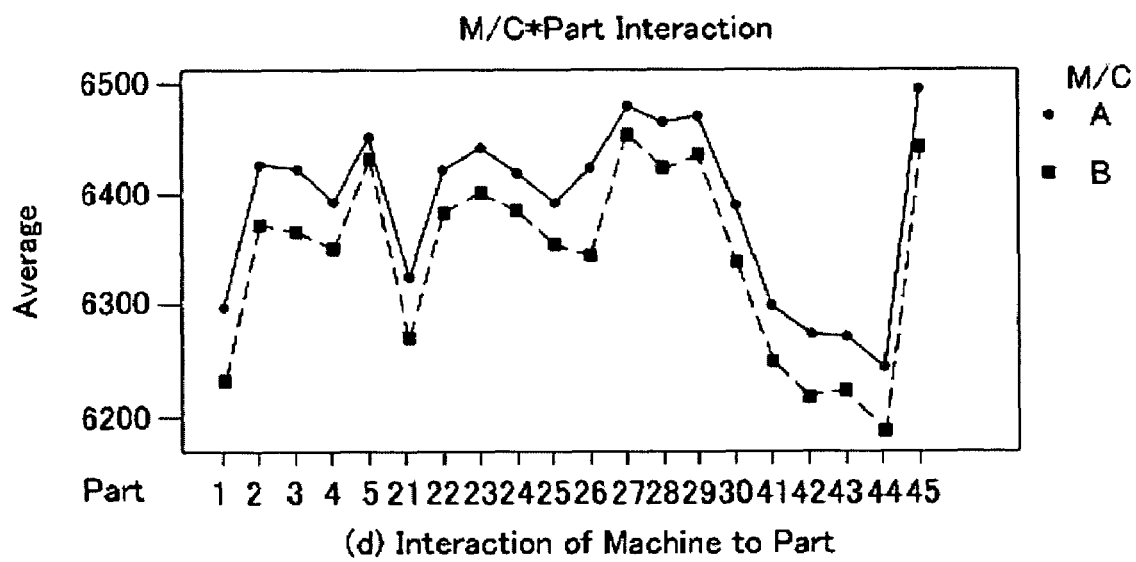

Also, referring to FIG. 16D, two measurement apparatuses A and B measure different parts or products differently, but consistently part-to-part, which means that a measurement-equipment error factor has been considerably reduced. Repeatability, as shown by the measurement equipment error, is considerably improved by the new measuring method, but reproducibility as shown by the error between two apparatuses contributes 15.59% of the total variation, which shows that improvement apparatus-to-apparatus variation improvement would be beneficial.

As described above, when a polishing amount of a CMP process is monitored or managed by summing thicknesses of similar layers in an interlayer dielectric or ILD (e.g., the three oxide layers representative of first to third insulating layers 5-1 to 5-3 in FIGS. 1A-1D), a measurement-equipment variation factor can be considerably reduced, so that one or more process factor variations can be reduced or avoided. Also, a gage-error can be reduced even more when an improved method that reduces measurement value variations between two measurement apparatuses is performed.

Figure 17:
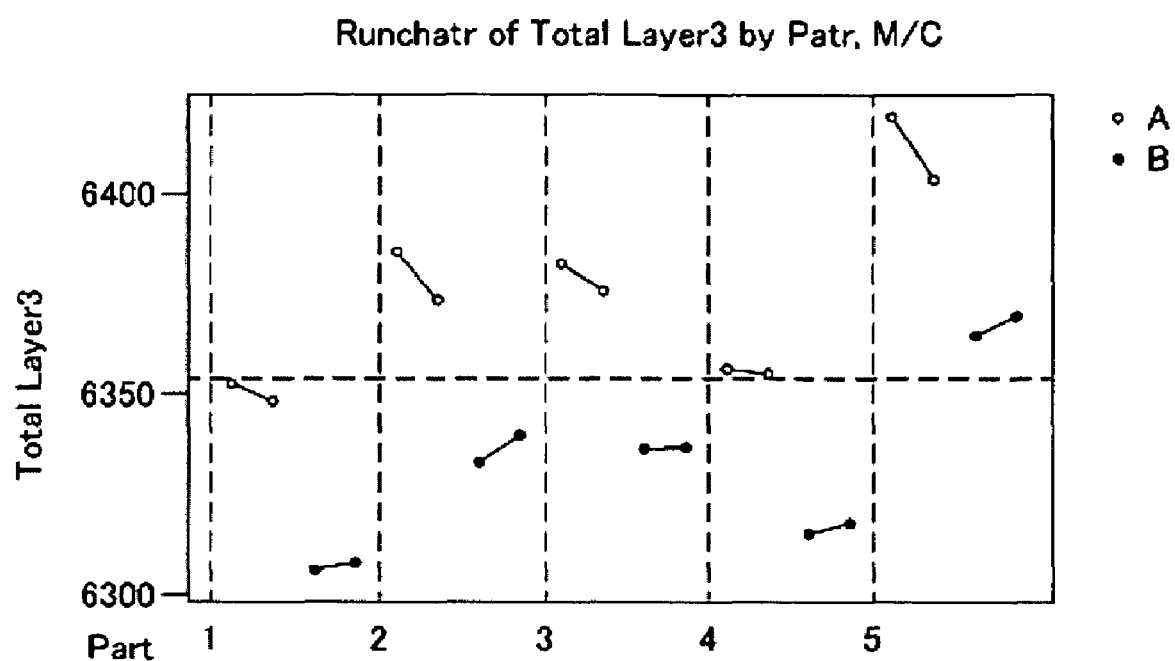
FIG. 17 is a graph showing a variation in a thickness obtained by measuring three upper layers using a measurement apparatus.

FIG. 17 illustrates a variation in a thickness for the same point (No. 8) on each of a group of five wafers when the combined thicknesses of three oxide layers (first to third interlayer insulating layers) are measured according to the present invention. In FIG. 17, the same measurements as in FIG. 13 are taken, but the measurement data variation has a maximum value of 15 Å, which is reduced by 70 Å compared to the related art method, resulting in a considerable reduction of measurement error.

The reason the analysis of data using the new measuring method that measures a combined thickness of three oxide layers (first to third interlayer insulating layers) is excellent is that an error caused by inaccuracy of a boundary disappears when the three oxide layers (first to third interlayer insulating layers) are measured together. The inaccuracy of the boundary occurs when a measurement layer is divided in a case where analysis is made using only the third (uppermost) insulating layer.

According to the above-described analysis results, to reduce a measurement-equipment error in a copper CMP process and to discriminate such errors from process factor variations, the thickness of the material being polished should be or comprise a plurality of layers having similar properties, such as refractive indexes (e.g., the three oxide layers representing first to third insulating layers 5-1 to 5-3 in FIGS. 1A-1D).

The present invention has the following effects. According to the present invention, a polishing amount is measured, monitored and/or managed using an entire thickness (e.g., first to third insulating material layers) of an interlayer insulating layer comprising similar materials, so that process factor variations and error factor variations can be discriminated. Accordingly, the process factor variation can be analyzed, if desired and/or necessary. As a result, one or more error(s) may be reduced and the reliability of measurement data may improve, which contributes to improvements in product yield (e.g., through constant process improvement).

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A CMP (chemical mechanical polishing) method comprising:
    etching an insulating layer including two or more layers to form a trench and/or via hole therein;
    measuring a first thickness of the two or more stacked layers of the insulating layer;
    sequentially forming a baffler metal layer and a metal layer in the trench and/or via hole;
    removing a portion of the metal layer, portions of the barrier metal layer and a portion of only an uppermost stacked layer of the insulating layer by chemical mechanical polishing; and
    measuring a second thickness of the two or more stacked layers of the insulating layer after the chemical mechanical polishing.

2. The method according to claim 1, wherein the insulating layer comprises an oxide-based insulating layer.

3. The method according to claim 1, wherein the insulating layer comprises three layers.

4. The method according to claim 3, wherein the insulating layer comprises a first oxide layer, a second oxide layer, and a third oxide layer.

5. The method according to claim 3, wherein the insulating layer comprises USG (undoped silicate glass), FSG (fluorine-doped silica glass), and a plasma silane (P—SiH4).

6. The method according to claim 5, wherein the USG has a thickness of 400-600 Å, the FSG has a thickness of 4000-6000 Å, and the P—$SiH_4$ has a thickness of 100-2000 Å.

7. The method according to claim 1, further comprising forming SiN in a lower portion of the insulating layer.

8. The method according to claim 7, wherein the SiN has a thickness of 600-800 Å.

9. A method for performing chemical mechanical polishing (CMP) on a semiconductor substrate having two or more stacked insulating layers with similar characteristics, the method comprising:
    measuring a first thickness of the combined two or more similar insulating layers before the chemical mechanical polishing; forming a metal layer on an upper surface of the two or more stacked insulating layers after measuring the first thickness;
    chemical mechanical polishing a portion of only an uppermost layer of the two or more stacked insulating layers; and
    measuring a second thickness of the two or more stacked insulating layers after the chemical mechanical polishing.

10. The method according to claim 9, further comprising forming a trench and/or via hole in at least one of the two or more stacked insulating layers after measuring the first thickness.

11. The method according to claim 9, wherein measuring the thicknesses of the two or more similar insulating layers comprises measuring a combined thickness of the stacked similar insulating layers.

12. The method according to claim 9, wherein the two or more similar insulating layers each comprise an oxide layer.

13. A method for manufacturing a semiconductor device, the method comprising:
    forming an insulating layer including a first insulating layer, a second insulating layer on the first insulating layer, and a third insulating layer on the second insulating layer;
    etching the first, second and third insulating layers to form a trench and/or via hole therein;
    measuring a first thickness of the first, second and third insulating layers;
    sequentially forming a barrier metal layer and a metal layer in the trench and/or via hole;
    removing portions of the metal layer, the barrier metal layer and only the third insulating layer; and
    measuring a second thickness of the first, second and third insulating layers after removing portions of the metal layer, the barrier metal layer and only the third insulating layer.

14. The method according to claim 13, wherein each of the first to third insulating layers comprises an oxide-based insulating layer.

15. The method according to claim 13, wherein the first insulating layer comprises USG, the second insulating layer comprises FSG, and the third insulating layer comprises a plasma silane (P—$SiH_4$).

16. The method according to claim 15, wherein the USG has a thickness of 400-600 Å, the FSG has a thickness of 4000-6000 Å, and the P—$SiH_4$ has a thickness of 100-2000 Å.

17. The method according to claim 13, further comprising forming SiN in a lower portion of the interlayer insulating layer.

18. The method according to claim 17, wherein the SiN has a thickness of 600-800 Å.

19. The method according to claim 13, wherein the metal layer comprises copper.

* * * * *